United States Patent
Yao et al.

(10) Patent No.: US 11,196,683 B2
(45) Date of Patent: *Dec. 7, 2021

(54) SWITCH WITH SIDE PORTS

(71) Applicant: Facebook, Inc., Menlo Park, CA (US)

(72) Inventors: Zhiping Yao, Santa Clara, CA (US); Che Kin Leung, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 16/724,204

(22) Filed: Dec. 21, 2019

(65) Prior Publication Data
US 2020/0127944 A1 Apr. 23, 2020

Related U.S. Application Data

(63) Continuation of application No. 15/726,343, filed on Oct. 5, 2017, now Pat. No. 10,567,309.

(51) Int. Cl.
H04L 12/931 (2013.01)
H05K 7/14 (2006.01)
H04L 12/933 (2013.01)

(52) U.S. Cl.
CPC .............. *H04L 49/40* (2013.01); *H04L 49/15* (2013.01); *H05K 7/1492* (2013.01)

(58) Field of Classification Search
CPC ........ H04L 49/40; H04L 49/15; H05K 7/1492
See application file for complete search history.

(56) References Cited

U.S. PATENT DOCUMENTS

| 6,373,840 | B1* | 4/2002 | Chen | H04L 49/351 370/360 |
| 6,600,727 | B1 | 7/2003 | Mackay | |
| 6,785,286 | B1 | 8/2004 | O'Keeffe | |
| 8,929,205 | B2* | 1/2015 | Hinosugi | H04L 49/557 370/228 |
| 10,567,309 | B2* | 2/2020 | Yao | H04L 49/15 |

* cited by examiner

Primary Examiner — Steven H Nguyen
(74) Attorney, Agent, or Firm — Van Pelt, Yi & James LLP

(57) ABSTRACT

Data center switches are described. A rack of a data center can include several switches to implement a network topology. The switches can include ports on their fronts and sides such that cables can be coupled with these side ports to implement the network topology.

20 Claims, 5 Drawing Sheets

SWITCH WITH SIDE PORTS

CROSS REFERENCE TO OTHER APPLICATIONS

This application is a continuation of co-pending U.S. patent application Ser. No. 15/726,343 entitled SWITCH WITH SIDE PORTS filed Oct. 5, 2017 which is incorporated herein by reference for all purposes.

TECHNICAL FIELD

This disclosure relates to a switch with side ports to implement a switch network topology among switches of a rack for data center configurations.

BACKGROUND OF THE INVENTION

Data centers can include a large number of switches directing data (e.g., formatted within a network packet) among a large number of servers. These switches and servers are often mounted within racks, and the data centers can include hundreds, thousands, or more racks.

The interconnect coupling the switches to each other and, therefore, directing data to the servers can be based on a variety of architectures or network topologies. For example, a Clos network includes coupling switches in a multi-stage hierarchy to provide non-blocking functionality such that any input can be provided to any output while reducing the number of ports. A butterfly network includes organizing switches within "ranks" and coupling a switch in one rank with two switches in an adjacent rank. This can result in fewer switches used, but the butterfly network is a blocking network. Thus, different network topologies can provide different advantages and disadvantages.

The switches within the racks can include printed circuit boards (PCBs) having traces, or interconnects, routing ports on the front of the switch (e.g., a port that is accessible from the front side of rack when the switch is within the rack) to a switch application-specific integrated circuit (ASIC) that can route data among the ports and, therefore, among other switches, servers, and other equipment within the data center implementing the network topology. Thus, to implement the network topology, the ports of the switches within the same or different racks can be coupled together with cables. The length of the traces on the PCB coupling the switch ASIC with the ports can provide a limitation to the length of the corresponding cables that are coupled with the ports to implement the network topology. For example, a longer trace on the PCB results in a shorter cable due to issues such as signal integrity (SI).

BRIEF DESCRIPTION OF THE DRAWINGS

Various embodiments of the invention are disclosed in the following detailed description and the accompanying drawings.

DETAILED DESCRIPTION

Figure 1:
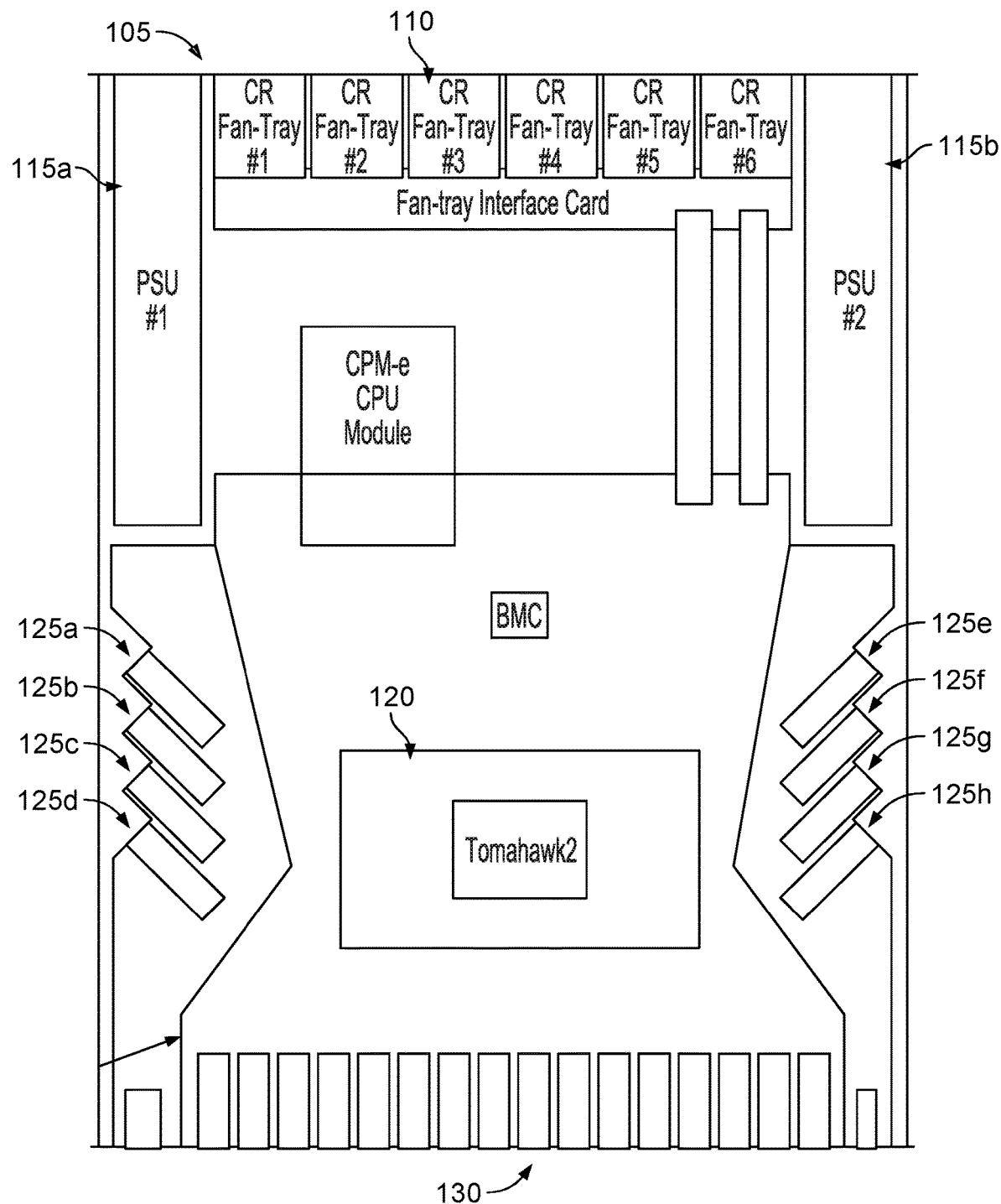
FIG. 1 illustrates an example of a switch with side ports.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Some of the material described in this disclosure includes systems and techniques for implementing a switch with side ports. In one example, a switch can include a printed circuit board (PCB) having a switch application-specific integrated circuit (ASIC) assembled upon it. The switch can also include ports used to couple copper or fiber optic cabling with other ports (e.g., of other switches) to implement a network topology. Some of the ports can be on a front-side of the switch. That is, some of the ports of the switch can be arranged on a housing of the switch such that the ports are exposed on the front side of a rack when the switch is housed within the rack. Traces, or interconnect, upon the PCB can couple the ports on the front-side of the switch with input/output (I/O) of the switch ASIC. Additionally, the switch can include side ports on the sides of the switch. That is, some of the ports of the switch can be arranged on the left-side and right-side of the switch. Because the side ports are closer to the switch ASIC, the traces or interconnect between the side ports and the I/O of the switch ASIC upon the PCB can be shorter in length than the interconnect between the front ports and the I/O of the switch ASIC. This can result in being able to use longer cabling with the side ports to implement the network topology because a shorter length of the interconnect upon the PCB can result in better signal integrity (SI). Moreover, the side ports can be implemented with larger, higher data rate ports than the front-side ports.

In more detail, data centers can include racks providing a physical structure (e.g., an enclosure, housing, frame, etc.) for mounting devices such as switches, servers, and other networking equipment. A data center can include thousands of racks and, therefore, thousands of switches and servers.

The individual switches within a single rack or among multiple racks can be coupled together with cables as interconnect (e.g., optical fiber, copper cabling, or other types of cables) to implement a larger network of switches, or switch network (or network switch). The arrangement of the interconnect among the individual switches can define a network topology or architecture of the larger switch network. For example, a Clos network can include a multi-stage hierarchy of switches that are coupled together in an arrangement that is different than a butterfly network. Other types of network topologies can include mesh (e.g., full mesh), tree, and many others. Additionally, the switch networks can be of different sizes. For example, one Clos network might use more switches than another Clos network to provide a larger switch network composed of the individual switches within the racks.

The different topologies allow for different advantages and disadvantages. For example, some switch networks (e.g., Clos networks) are non-blocking such that any input can be provided to any output. Others might not be non-blocking (i.e., some inputs can only be routed to certain outputs), but might provide other advantages such as speed, reduced cost due to using fewer switches, etc.

FIG. 1 illustrates an example of a switch with side ports. Switch 105 can be a switch that can be used with other switches to implement a switch network in accordance with a network topology. Switch 105 in FIG. 1 includes fans 110 to provide cooling as the various components generate heat, power supplies 115a and 115b to power the various components, and switch ASIC 120. Switch ASIC 120 can be used to route data (e.g., packets) among side ports 125a-h and front ports 130. The data can be routed from one port to another of switch 105 based on a destination of the data and the network topology that the switch is partly implementing. Such routing can be performed by switch ASIC 120.

Switch ASIC 120 can be assembled upon a PCB, for example, soldered, surface mounted, etc. The PCB can include traces, or interconnect, coupling the various I/Os of switch ASIC 120 with corresponding ports. For example, side port 125a can be coupled with switch ASIC 120 via one interconnect. One of the front switches 130 can be coupled with switch ASIC 120 via another interconnect. Thus, each of the ports can be coupled with a corresponding I/O of switch ASIC 120, resulting in data received by switch ASIC 120 on one port to be analyzed and then routed to another port by switch 120.

As depicted in FIG. 1, there are four side ports on each side of switch 105. For example, side ports 125a-d are on one side of switch 105 (e.g., on the left side of switch 105 if it is inserted into a rack). Side ports 125e-f are on the other side of switch 105 (e.g., on the right side of switch 105 if it is inserted into a rack). Front ports 130 include sixteen ports on the front side that can be exposed to a user or technician servicing a rack that houses switch 105.

Side switches 125a-h can be closer in distance to switch ASIC 120 than front ports 130. For example, the interconnect or trace on the PCB from side port 125a to an I/O of switch ASIC 120 can be shorter in length than the interconnect or trace on the PCB from one of the front ports 130 to an I/O of switch ASIC 120. This results in better signal integrity for the signals propagating via side ports 125a-h than front ports 130 because there is less signal loss for a shorter interconnect on a PCB. Additionally, due to the better signal integrity, the cables coupled with side ports 125a-h can be longer than the cables coupled with front ports 130. For example, a cable coupling side port 125a to a side port of another switch can be longer than a cable coupling one of front ports 130 to another port.

Thus, a shorter interconnect or trace on the PCB associated with a port results in being able to user a longer cable attached to the port coupling the switch to another switch (or a port of that switch to another port of the same switch). This can be beneficial because some network topologies might involve coupling ports of switches that might be arranged in the same rack some distance apart from each other, or even switches among different racks. If the distance between the switches is long, then longer cables are useful to be able to fulfill the couplings and implement the desired network topology. In a simplified example, an interconnect or trace that is one inch smaller than another interconnect or trace can result in the corresponding cable coupling the port to another port to be one foot longer in length. Thus, as previously discussed, reducing the length of the interconnect upon the PCB can allow for longer cables.

If the rack that switch 105 with side ports 125a-h is inserted within includes space along the sides (e.g., fifteen inches of space between switch 105 and the housing of the rack or other components housed within the rack), then the cables for side ports 125a-h can be inserted into the corresponding ports. The cables can then be routed along the sides and back of the rack. In other scenarios, some racks might use cooling components such as fans 110 along the sides and, therefore, side ports 125a-h would not be able to be implemented. By contrast, the implementations described herein preserve space along the sides of the racks next to switch 105 to allow for side ports 125a-h and corresponding cabling.

In some implementations, front ports 130 can be Quad Small Form-factor Pluggable (QSFP) ports used for data communications within the data center. However, side ports 125a-h can be QSFP double density (QSFP-DD) ports which can be larger in size than the QSFP front ports 130 (e.g., providing eight lane electrical interfaces rather than four lane electrical interfaces of QSFP), but also support a higher data rate (e.g., double the data rate, or a higher bandwidth). Thus, side ports 125a-h can support higher bitrates than front ports 130, for example, 25 gigabits per second due to the shorter interconnects upon the PCB and being able to use larger ports along the sides.

Figure 2:
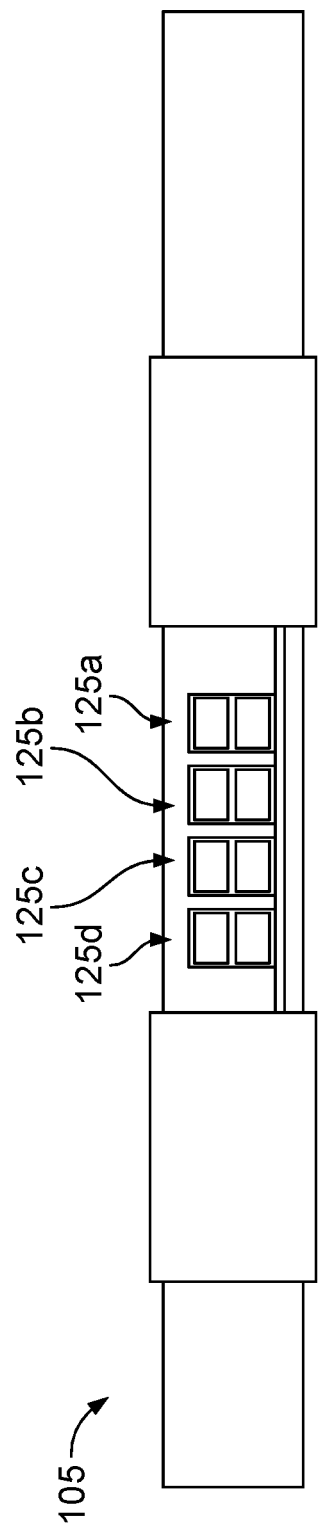
FIG. 2 illustrates an example of side ports of a switch.

FIG. 2 illustrates an example of side ports of a switch. In FIG. 2, a side view of switch 105 is portrayed showing side ports 125a-d accessible via the side. This allows for cables to couple with the ports along the side, as previously discussed.

Figure 3:
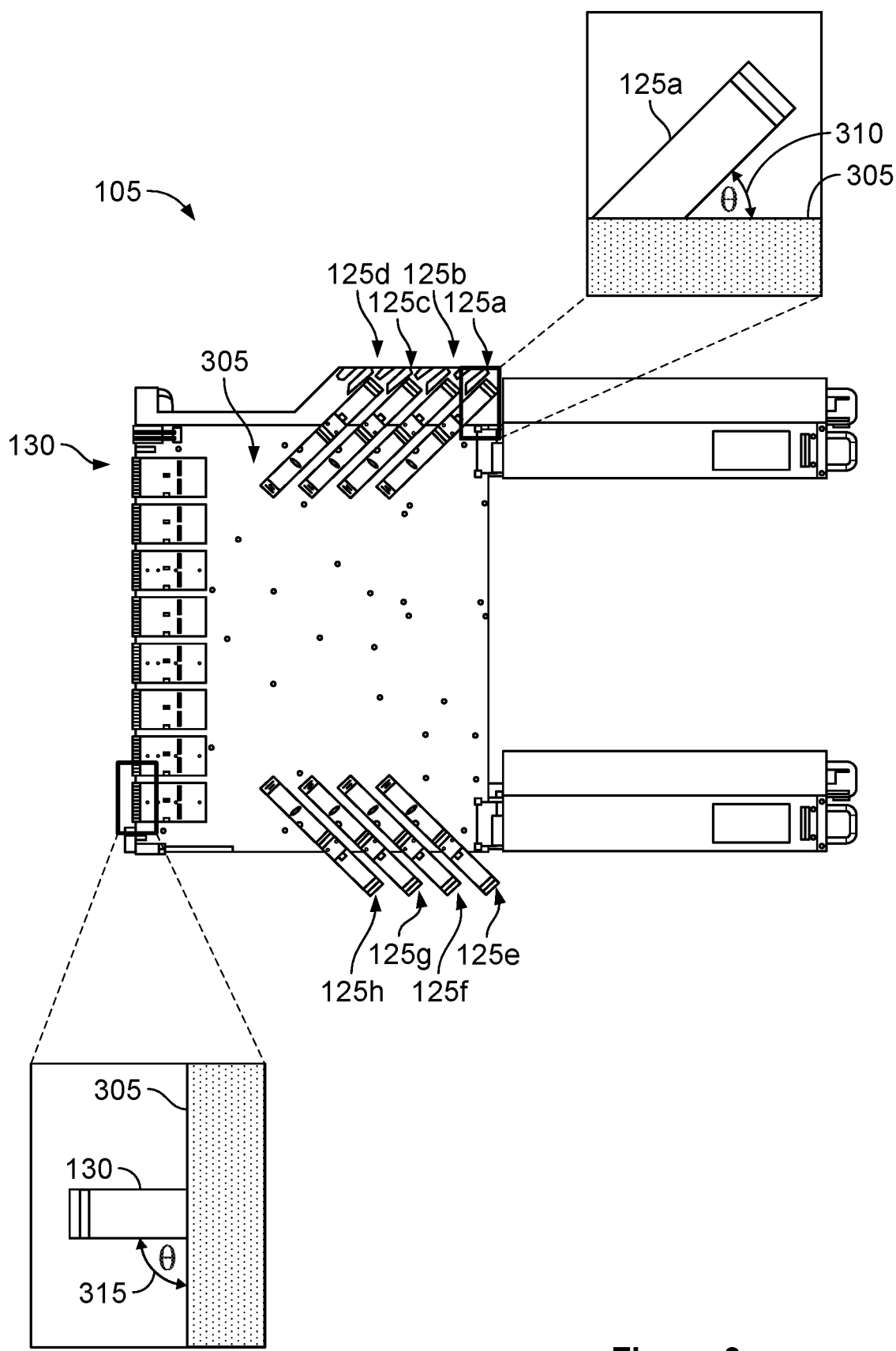
FIG. 3 illustrates an example of angled side ports of a switch.

In some implementations, side ports 125a-g can be angled to allow for cables to be coupled with the ports via a back side of the network rack housing switch 105. FIG. 3 illustrates an example of angled side ports of a switch. In FIG. 3, side ports 125a-h can be mounted upon PCB 305 (which can include switch ASIC 120) at an angle to allow for easy access for cables from the back side of switch 105 and the rack that it is to be housed within. For example, as depicted, angle 310 of side port 125a with respect to PCB 305 can be different than angle 315 between one of front ports 130 and a different edge of PCB 305. That is, in contrast with front ports 130 which are mounted at ninety degree angles to the edge of PCB 305, side ports 125a-h can be mounted at different angles such as forty-five degrees with respect to the edge of PCB 305. For example, the portion of side port 125a that a cable plugs into can be closer to the back side of switch 105 (or the back side of the rack housing switch 105) than the portion of side port 125a that is mounted upon PCB 305. However, in other implementations, the angle can be reversed such that side ports 125a-h can be accessible from the same side as front ports 130.

Figure 4:
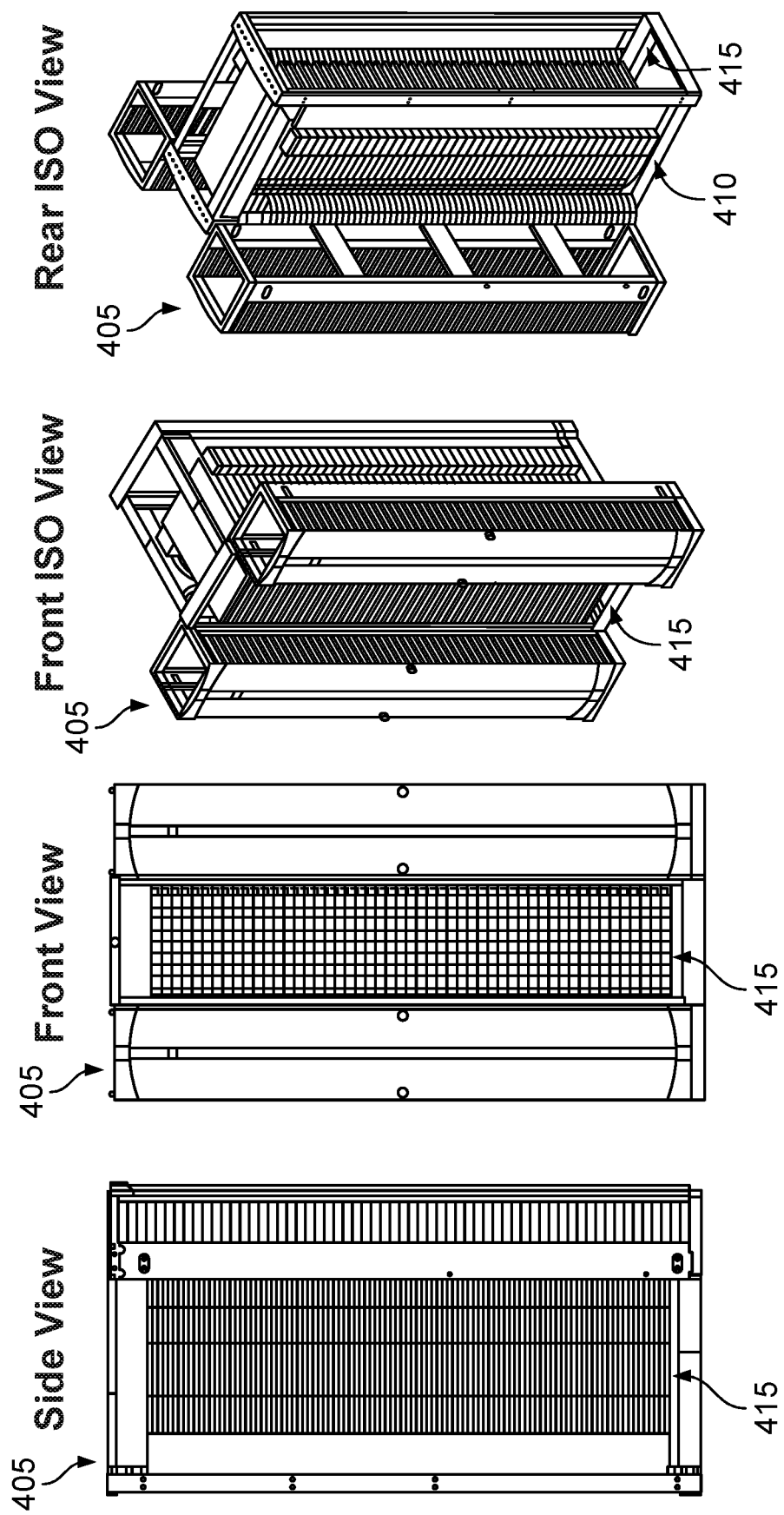
FIG. 4 illustrates an example of a rack housing switches with side ports.

FIG. 4 illustrates an example of a rack housing switches with side ports. As depicted in FIG. 4, rack 405 can include several switches 415 with side ports (e.g., 48 switches). In FIG. 4, the sides of the switches are accessible from the rear, allowing for cables to be easily plugged into side ports 410 (e.g., side ports 125a-h) from the rear of rack 410, as previously discussed. Additionally, rack 405 includes space (e.g., an air gap) along the sides of switches 415 (e.g., including switch 105) to allow for side ports 410 and the corresponding cables. Thus, the cables can be placed or arranged to couple with side ports 410 and be between a wall of rack 405 (e.g., the housing or enclosure of rack 405) and switches 415. In one example, rack 405 can be nineteen inches wind to hold many switches 105, for example, forty-eight switches. Thus, switch 105 of FIG. 1 can be used as a "building-block" to implement network topologies using groupings of switches within racks 405.

The switches and racks disclosed herein can also allow for a large, scalable network switch. For example, Clos, cross-connect, full mesh, cube, butterfly, tree, and other types of network topologies can be more easily implemented and made larger and more scalable due to being able to use longer cables to couple ports of switches. Additionally, the systems and techniques described herein can reduce power consumption of rack 405 because fewer active components are used due to the reduced signal loss and better signal integrity. The switches disclosed herein can also result in an easier-to-design rack, for example, by reducing the mechanical design of cable backplanes.

In some implementations, the cabling to couple different ports of switches can be a Direct Attach Copper (DAC) cable.

Many of the examples described herein include a switch ASIC. However, the switch circuit implemented by the switch ASIC can also be implemented by other types of circuits, for example, programmable logic devices including field programmable gate arrays (FPGAs), structured ASICs, processors, etc.

Figure 5:
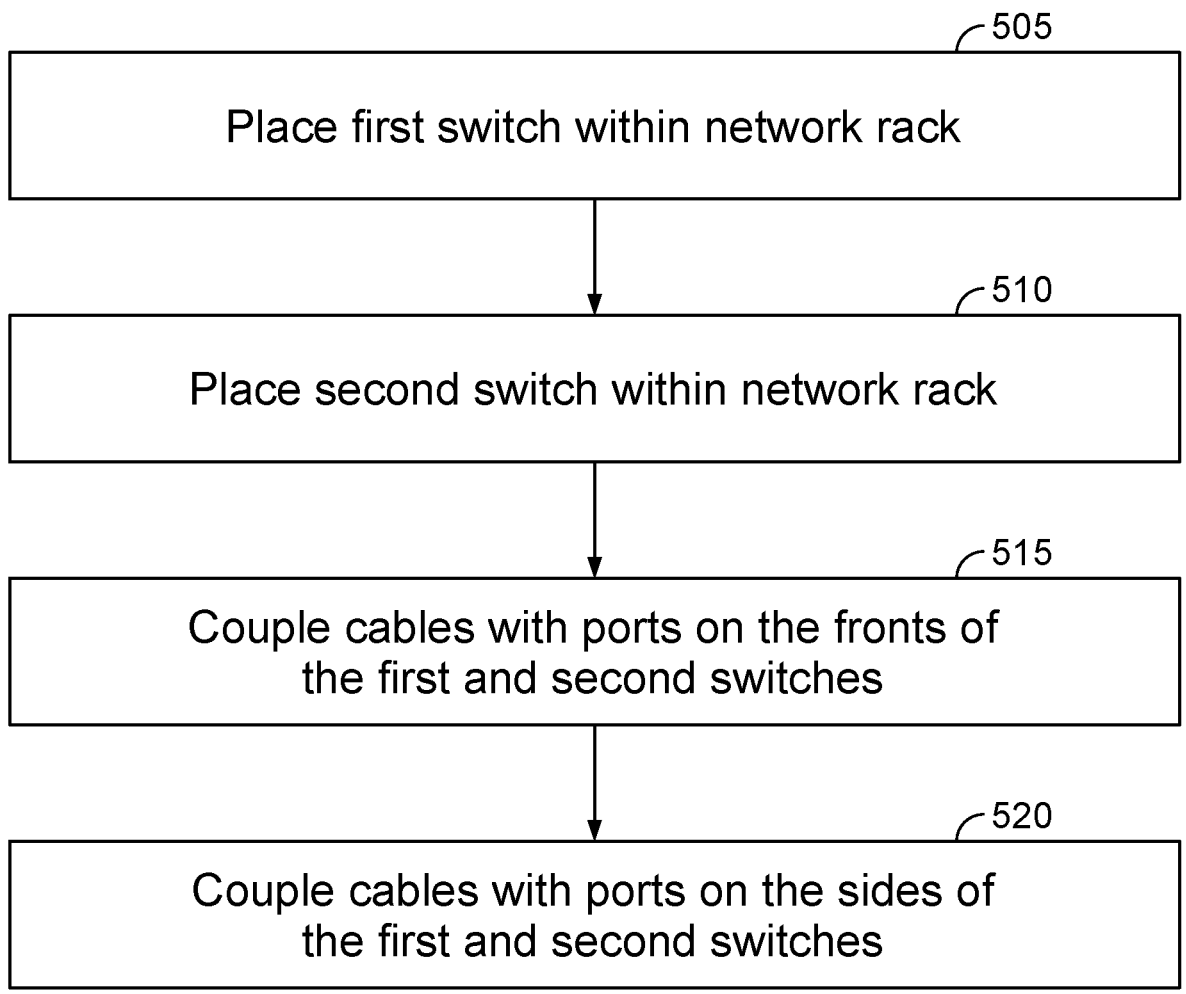
FIG. 5 illustrates an example of a block diagram for using side ports of switches.

FIG. 5 illustrates an example of a block diagram for using side ports of switches. In FIG. 5, a first switch can be placed within a network rack (505). For example, switch 105 in FIG. 1 can be placed within rack 405 in FIG. 4. Another switch can also be placed within the network rack (510). For example, another switch 105 can be placed within rack 405 to implement a network topology, as previously discussed. To implement that network topology, cables can be coupled with ports on the fronts of the switches (515) as well as ports on the sides of the switches (520). For example, cables can be coupled with side ports 125a-h of switch 105 in FIG. 1.

From the foregoing, it will be appreciated that specific embodiments of the invention have been described herein for purposes of illustration, but that various modifications may be made without deviating from the scope of the invention. Accordingly, the invention is not limited except as by the appended claims.

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one implementation," "an implementation," "one embodiment," or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Those skilled in the art will appreciate that the logic illustrated in each of the flow diagrams discussed above, may be altered in various ways. For example, the order of the logic may be rearranged, substeps may be performed in parallel, illustrated logic may be omitted; other logic may be included, etc.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A network rack, comprising:
  a first switch having a front, a back, and first side joining the front to the back and a second side joining the front to the back, wherein the first switch has a first front port on the front and a second port on the first side, and the second port on the first side of the first switch is a small form-factor pluggable (SFP) type port physically facing at an angle different from at least a portion of the first side of the first switch;

a second switch having a front, a back, and first side joining the front to the back and a second side joining the front to the back, wherein the second switch has a first front port on the front of the second switch and a second port on the first side of the second switch, and the second port on the first side of the second switch is a small form-factor pluggable (SFP) type port physically facing at an angle different from at least a portion of the first side of the second switch;

wherein the first front port on the front of the first switch is configured to be coupled with the first front port on the front of the second switch via a first cable; and wherein the second port on the first side of the first switch is configured to be coupled with the second port on the first side of the second switch via a second cable.

2. The network rack of claim 1, further comprising:
the first cable, wherein the first cable has a first length; and
the second cable, wherein the second has a second length longer than the first length.

3. The network rack of claim 2, wherein the first cable and the second cable include copper cabling.

4. The network rack of claim 2, wherein the second cable coupling the second port on the first side of the first switch with the second port on the first side of the second switch is arranged between a wall of the network rack and the first switch.

5. The network rack of claim 2, wherein the first cable and the second cable include optical fiber.

6. The network rack of claim 1, wherein the first switch includes a switch circuit on a printed circuit board (PCB), a first interconnect couples the first front port on the front of the first switch with the switch circuit, a second interconnect couples the second port on the first side of the first switch with the switch circuit, the first interconnect having a first length, the second interconnect having a second length, the second length being shorter than the first length.

7. The network rack of claim 1, wherein the first front port on the front of the first switch and the first front port on the front of the second switch correspond to a first data rate, the second port on the first side of the first switch and the second port on the first side of the second switch correspond to a second data rate, the first data rate and the second data rate being different data rates.

8. The network rack of claim 7, wherein the second data rate is higher than the first data rate.

9. The network rack of claim 1, wherein the second port on the first side of the first switch is angled towards a back side of the network rack.

10. A switch including:
a front;
a back;
a first side joining to the front to the back;
a second side joining the front to the back;
a first port on the front of the switch, wherein the first port is configured to be coupled with a front port on the front of another switch via a first cable;
a second port on the first side of the switch, wherein the second port is configured to be coupled with a second port on a first side of another switch via a second cable;
wherein the second port on the first side of the switch is a small form-factor pluggable (SFP) type port physically facing at an angle different from at least a portion of the first side of the switch.

11. The switch of claim 10, wherein the second cable is longer than the first cable.

12. The switch of claim 11, wherein the first cable and the second cable include copper cabling.

13. The switch of claim 11, wherein the first cable and the second cable include optical fiber.

14. The switch of claim 10, wherein the switch includes a switch circuit, wherein a first interconnect couples the first front port on the front of the switch with the switch circuit, a second interconnect couples the second port on the first side of the switch with the switch circuit, the first interconnect having a first length, the second interconnect having a second length, the second length being shorter than the first length.

15. The switch of claim 10, wherein the first front port on the front of the switch corresponds to a first data rate, the second port on the first side of the switch corresponds to a second data rate, the first data rate and the second data rate being different data rates.

16. The switch of claim 15, wherein the second data rate is higher than the first data rate.

17. The switch of claim 10, wherein the second port on the first side of the switch is angled towards a back side of the switch.

18. A method comprising:
providing a first switch having a front, a back, and first side joining the front to the back and a second side joining the front to the back, wherein the first switch has a first front port on the front and a second port on the first side, and the second port on the first side of the first switch is a small form-factor pluggable (SFP) type port physically facing at an angle different from at least a portion of the first side of the first switch;
providing a second switch having a front, a back, and first side joining the front to the back and a second side joining the front to the back, wherein the second switch has a first front port on the front of the second switch and a second port on the first side of the second switch, and the second port on the first side of the second switch is a small form-factor pluggable (SFP) type port physically facing at an angle different from at least a portion of the first side of the second switch;
coupling the first front port on the front of the first switch to the first front port on the front of the second switch via a first cable; and
coupling the second port on the first side of the first switch to the second port on the first side of the second switch via a second cable.

19. The method of claim 18, further comprising:
providing the first cable, wherein the first cable has a first length; and
providing the second cable, wherein the second has a second length longer than the first length.

20. The method of claim 19, wherein the first cable and the second cable include at least one of copper cabling and optical fiber.

* * * * *